(12) United States Patent
Komatsu et al.

(10) Patent No.: US 11,603,480 B2
(45) Date of Patent: Mar. 14, 2023

(54) COMPOSITION FOR UNDERLAYER FILM FORMATION, UNDERLAYER FILM FOR DIRECTED SELF-ASSEMBLED FILM AND FORMING METHOD THEREOF, AND DIRECTED SELF-ASSEMBLY LITHOGRAPHY PROCESS

(71) Applicant: JSR CORPORATION, Tokyo (JP)

(72) Inventors: Hiroyuki Komatsu, Tokyo (JP); Motohiro Shiratani, Tokyo (JP); Miki Tamada, Tokyo (JP)

(73) Assignee: JSR CORPORATION, Tokyo (JP)

( * ) Notice: Subject to any disclaimer, the term of this patent is extended or adjusted under 35 U.S.C. 154(b) by 706 days.

(21) Appl. No.: 16/528,707

(22) Filed: Aug. 1, 2019

(65) Prior Publication Data
US 2020/0040209 A1    Feb. 6, 2020

(30) Foreign Application Priority Data

Aug. 3, 2018   (JP) .............................. JP2018-147144

(51) Int. Cl.
| | | |
|---|---|---|
| *G03F 7/11* | (2006.01) | |
| *C09D 125/14* | (2006.01) | |
| *C09D 133/14* | (2006.01) | |
| *C08F 220/14* | (2006.01) | |
| *C08F 212/08* | (2006.01) | |
| *C08L 53/00* | (2006.01) | |
| *C08L 53/02* | (2006.01) | |

(52) U.S. Cl.
CPC .......... *C09D 125/14* (2013.01); *C08F 212/08* (2013.01); *C08F 220/14* (2013.01); *C08L 53/00* (2013.01); *C08L 53/02* (2013.01); *C09D 133/14* (2013.01); *G03F 7/11* (2013.01)

(58) Field of Classification Search
CPC ................................ C08L 53/00; C08L 53/02
See application file for complete search history.

(56) References Cited

U.S. PATENT DOCUMENTS

| | | | | |
|---|---|---|---|---|
| 5,115,035 A * | 5/1992 | Shiraki | ..................... | C08F 8/30 525/271 |
| 2009/0214823 A1 | 8/2009 | Cheng et al. | | |

(Continued)

FOREIGN PATENT DOCUMENTS

| | | |
|---|---|---|
| JP | 2002-519728 A | 7/2002 |
| JP | 2003-218383 A | 7/2003 |

(Continued)

OTHER PUBLICATIONS

Office Action dated Jun. 14, 2022, in corresponding Japanese Patent Application No. 2018-147144 (with English Translation), 7 pages.

(Continued)

*Primary Examiner* — Amanda C. Walke
(74) *Attorney, Agent, or Firm* — Oblon, McClelland, Maier & Neustadt, L.L.P.

(57) ABSTRACT

A composition includes a polymer and a solvent. The polymer (A) satisfies at least one of the conditions (i) and (ii): (i) having in one terminal part of a main chain a block of a first structural unit that includes an amino group; and (ii) having a sulfur atom bonding to one end of the main chain, wherein a monovalent group that includes an amino group bonds to the sulfur atom.

20 Claims, 5 Drawing Sheets

(56) References Cited

U.S. PATENT DOCUMENTS

| | | | | |
|---|---|---|---|---|
| 2012/0029104 A1* | 2/2012 | Nagelsdiek | ............ | C08G 18/664 |
| | | | | 521/157 |
| 2014/0042662 A1* | 2/2014 | Tamada | ................. | B29C 39/02 |
| | | | | 427/535 |
| 2015/0166821 A1* | 6/2015 | Yi | ........................... | G03F 7/168 |
| | | | | 524/548 |
| 2016/0122580 A1* | 5/2016 | Hong | ................ | H01J 37/32009 |
| | | | | 524/505 |
| 2020/0118819 A1* | 4/2020 | Komatsu | ................... | G03F 7/26 |

FOREIGN PATENT DOCUMENTS

| | | | |
|---|---|---|---|
| JP | 2008-036491 A | 2/2008 | |
| JP | 2008-149447 A | 7/2008 | |
| JP | 2010-058403 A | 3/2010 | |
| JP | 2012-174984 A | 9/2012 | |
| JP | 2015-7233 A | 1/2015 | |
| JP | 7016314 B2 * | 2/2022 | ............ C08F 297/04 |

OTHER PUBLICATIONS

Office Action dated Nov. 30, 2021 in corresponding Japanese Patent Application No 2018-147144 (with English Translation), 12 pages.
Choi, Jonathan W. et al., "Self-Assembly and Post-Fabrication Functionalization of Microphase Separated Thin Films of a Reactive Azlactone-Containing Block Copolymer", Macromolecules, 2016, 49, pp. 8177-8186.

* cited by examiner

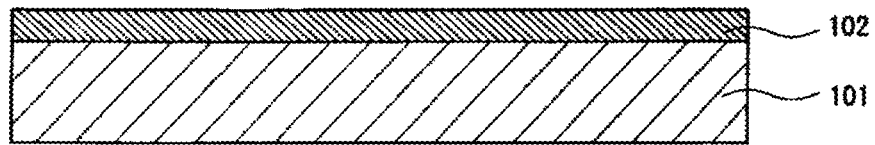
F I G. 1

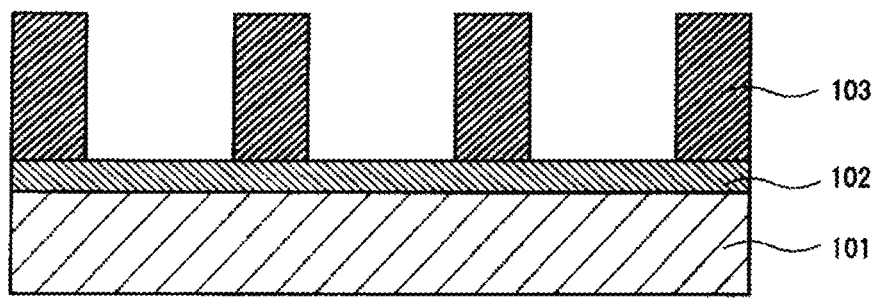
F I G. 2

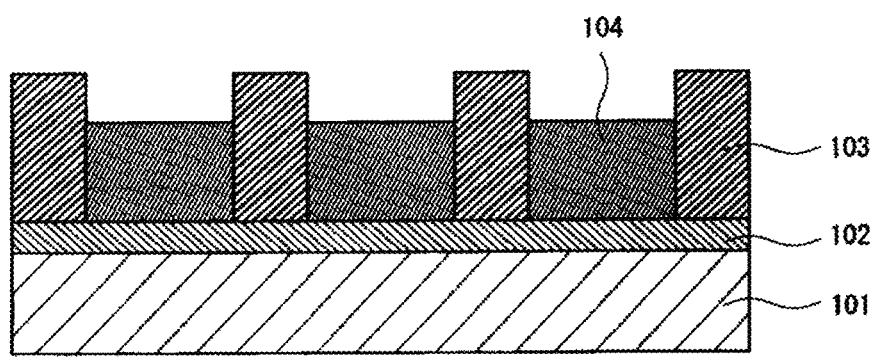
F I G. 3

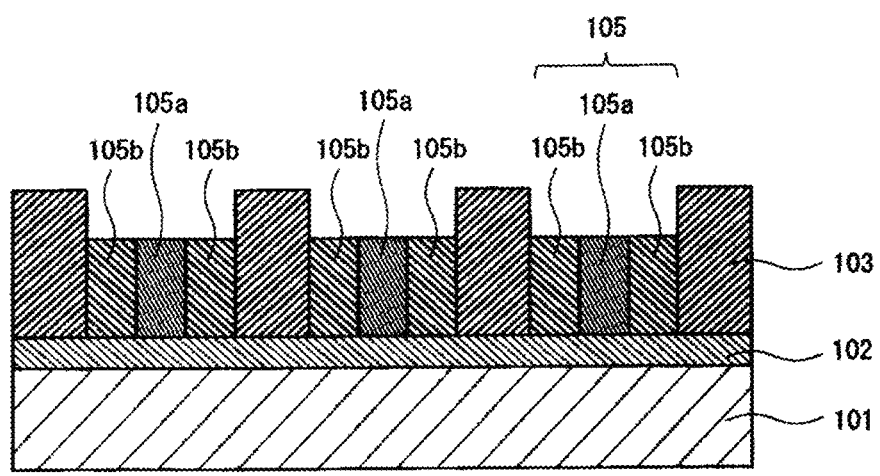
F I G. 4

COMPOSITION FOR UNDERLAYER FILM FORMATION, UNDERLAYER FILM FOR DIRECTED SELF-ASSEMBLED FILM AND FORMING METHOD THEREOF, AND DIRECTED SELF-ASSEMBLY LITHOGRAPHY PROCESS

CROSS-REFERENCE TO RELATED APPLICATIONS

The present application claims priority to Japanese Patent Application No. 2018-147144, filed Aug. 3, 2018, the contents of which are incorporated herein by reference in their entirety.

BACKGROUND OF THE INVENTION

Field of the Invention

The present invention relates to a composition for underlayer film formation, an underlayer film for directed self-assembled film and a forming method thereof, and a directed self-assembly lithography process.

Discussion of the Background

Microfabrication of various types of electronic device structures such as semiconductor devices and liquid crystal devices has been accompanied by demands for miniaturization of patterns in lithography processes. In these days, although fine patterns having a line width of about 90 nm can be formed using, for example, an ArF excimer laser, further finer pattern formation has been required.

To meet such demands, a directed self-assembly lithography process which utilizes a phase separation structure constructed through directed self-assembly, as generally referred to, that spontaneously forms an ordered pattern has been proposed. As such a directed self-assembly lithography process, a method for forming an ultrafine pattern by directed self-assembly using a block copolymer formed through copolymerization of monomers having different properties from one another has been known (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383). According to the method, annealing of a film containing the polymer results in a tendency of clustering of polymer structures having the same property, and thus a pattern can be formed in a self-aligning manner. In addition, a method of forming a fine pattern by permitting directed self-assembly of a composition that contains a plurality of polymers having properties that are different from one another has been also known (see U.S. Patent Application, Publication No. 2009/0214823, and Japanese Unexamined Patent Application, Publication No. 2010-58403).

It has been known that in such a directed self-assembly lithography process, formation of a film containing a component such as a polymer which should be subjected to the directed self-assembly on an underlayer film may effectively cause phase separation owing to the directed self-assembly. A variety of studies have been made in connection with the underlayer film, and formation of a variety of phase separation structures is reportedly enabled by appropriately controlling the surface free energy of the underlayer film in permitting the directed self-assembly of the block copolymer (see Japanese Unexamined Patent Application, Publication No. 2008-36491, and Japanese Unexamined Patent Application, Publication No. 2012-174984).

SUMMARY OF THE INVENTION

According to an aspect of the present invention, a composition includes a polymer and a solvent. The polymer (A) satisfies at least one of the conditions (i) and (ii): (i) having in one terminal part of a main chain a block of a first structural unit that includes an amino group; and (ii) having a sulfur atom bonding to one end of the main chain, wherein a monovalent group that includes an amino group bonds to the sulfur atom.

According to another aspect of the present invention, a composition includes a polymer and a solvent. The polymer satisfies at least one of conditions (I) and (II): (I) being obtained by anionic polymerization or controlled radical polymerization to allow a block of a first structural unit comprising an amino group to bond to one terminal part of a main chain; (II) being obtained by a click reaction or an SN2 reaction to introduce to one end of a main chain a monovalent group comprising an amino group.

According to further aspect of the present invention, an underlayer film for a directed self-assembled film in a directed self-assembly lithography process is formed from the aforementioned composition.

According to further aspect of the present invention, a method of forming an underlayer film for a directed self-assembled film in a directed self-assembly lithography process, includes applying the aforementioned composition directly or indirectly on a substrate to provide the underlayer film.

According to further aspect of the present invention, a directed self-assembly lithography process includes applying the aforementioned composition directly or indirectly on an upper face side of a substrate to provide an underlayer film. A composition capable of forming a directed self-assembled film is applied on the upper face side of the underlayer film to form a coating film. Phase separation of the coating film is allowed to form the directed self-assembled film having a plurality of phases. At least a part of the plurality of phases of the directed self-assembled film is removed to form a miniaturized pattern. The substrate is etched using the miniaturized pattern as a mask.

BRIEF DESCRIPTION OF THE DRAWINGS

FIG. 1 is a schematic cross sectional view illustrating one example of a state after forming an underlayer film in a directed self-assembly lithography process of the embodiment of the present invention;

FIG. 2 is a schematic cross sectional view illustrating one example of a state after forming a prepattern on the underlayer film in the directed self-assembly lithography process of the embodiment of the present invention;

FIG. 3 is a schematic cross sectional view illustrating one example of a state after applying a composition for use in formation of a directed self-assembled film to a region surrounded by the prepattern on the underlayer film in the directed self-assembly lithography process of the embodiment of the present invention;

FIG. 4 is a schematic cross sectional view illustrating one example of a state after forming a directed self-assembled film in a region surrounded by the prepattern on the underlayer film in the directed self-assembly lithography process of the embodiment of the present invention.

DESCRIPTION OF THE EMBODIMENTS

Figure 5:
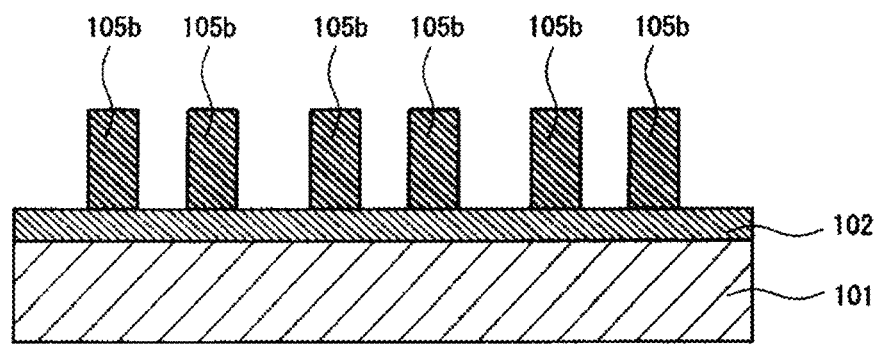
FIG. 5 is a schematic cross sectional view illustrating one example of a state after removing the prepattern and a part of a plurality of phases of the directed self-assembled film in the directed self-assembly lithography process of the embodiment of the present invention.

According to an embodiment of the invention, a composition for use in formation of an underlayer film for a directed self-assembled film in a directed self-assembly lithography process comprises a polymer and a solvent, in which the polymer satisfies at least one of conditions (i) and (ii):

(i) comprising in one terminal part of a main chain a block of a first structural unit comprising an amino group; and (ii) comprising a sulfur atom bonding to one end of the main chain, wherein a monovalent group comprising an amino group bonds to the sulfur atom.

According to another embodiment of the invention, a composition for use in formation of an underlayer film for a directed self-assembled film in a directed self-assembly lithography process comprises a polymer and a solvent, in which the polymer satisfies at least one of conditions (I) and (II):

(I) being obtained by anionic polymerization or controlled radical polymerization to allow a block of a first structural unit comprising an amino group to bond to one terminal part of a main chain; and (II) being obtained by a click reaction or an SN2 reaction to introduce to one end of a main chain a monovalent group comprising an amino group.

According to still another embodiment of the invention, an underlayer film for a directed self-assembled film in a directed self-assembly lithography process is formed from the composition of the aforementioned embodiment.

According to yet another embodiment of the invention, a method of forming an underlayer film for a directed self-assembled film in a directed self-assembly lithography process comprises providing an underlayer film directly or indirectly on an upper face side of a substrate by using the composition of the aforementioned embodiment.

According to yet still another embodiment of the invention, a directed self-assembly lithography process comprises: providing an underlayer film directly or indirectly on an upper face side of a substrate by using the composition of the aforementioned embodiment; applying a composition for use in formation of a directed self-assembled film on the upper face side of the underlayer film; allowing phase separation of a coating film provided after the applying; removing at least a part of a plurality of phases of the coating film obtained after the phase separation; and etching the substrate using a miniaturized pattern formed after the removing.

The "amino group" as referred to herein means a concept involving a primary amino group (—$NH_2$), a secondary amino group (—NHR, wherein R represents a monovalent organic group), and a tertiary amino group (—NRR', wherein R and R' each represent a monovalent organic group, or taken together represent a part of an aliphatic heterocyclic structure or an aromatic heterocyclic structure together with the nitrogen atom to which R and R' bond). The secondary amino group includes a group having a nitrogen atom to which one hydrogen atom bonds, such as "—$CH_2$—NH—" in a piperidyl group, a morpholyl group or the like. The tertiary amino group includes a group having a nitrogen atom to which no hydrogen atom bonds, such as "—CH=N—" in a pyridyl group or a quinolyl group, as well as "—$CH_2$—N(—$CH_2$—)—$CH_2$—" in an azabicyclooctyl group. It is to be noted that a cyano group does not fall under the definition of the tertiary amino group. The "organic group" as referred to herein means a group having at least one carbon atom. The "main chain" of a polymer as referred to means the longest one of the atom chains of the polymer. The "terminal part of a main chain" as referred to means a part including an end of the main chain.

The composition for underlayer film formation and the underlayer film for directed self-assembled film in a directed self-assembly lithography process of the embodiments of the present invention enable a phase separation structure being superior in orientation characteristic for arrangement to be formed by directed self-assembly. The forming method of the underlayer film of the embodiment of the present invention enables the underlayer film of the aforementioned embodiment to be readily and reliably formed. The directed self-assembly lithography process of the embodiment of the present invention enables a favorable pattern to be formed by using a phase separation structure, through directed self-assembly, that is superior in orientation characteristic for arrangement. Therefore, these can be suitably used in a lithography process in manufacture of various types of electronic devices such as a semiconductor device and a liquid crystal device, in which further progress of miniaturization is demanded.

Composition for Underlayer Film Formation

The composition for underlayer film formation is used for forming an underlayer film for a directed self-assembled film in a directed self-assembly lithography process. The composition for underlayer film formation contains a polymer (hereinafter, may be also referred to as "(A) polymer" or "polymer (A)" and a solvent (hereinafter, may be also referred to as "(B) solvent" or "solvent (B)"), the polymer (A) satisfying at least one of conditions (i) and (ii):

(i) having in one terminal part of a main chain a block of a first structural unit that includes an amino group; and (ii) having a sulfur atom bonding to one end of the main chain, wherein a monovalent group that includes an amino group bonds to the sulfur atom.

The composition for underlayer film formation may contain, in addition to the polymer (A) and the solvent (B), an optional component within a range not leading to impairment of the effects of the present invention. Hereinafter, each component is explained.

(A) Polymer

The polymer (A) satisfies at least one of conditions (i) and (ii):

(i) having in one terminal part of a main chain a block (hereinafter, may be also referred to as "block (I)") of a first structural unit (hereinafter, may be also referred to as "structural Unit (I)") that includes an amino group; and (ii) having a sulfur atom bonding to one end of the main chain, in which a monovalent group (hereinafter, may be also referred to as "group (I)") that includes an amino group bonds to the sulfur atom.

The polymer (A) typically has a structural unit (hereinafter, may be also referred to as "structural unit (II)") other than the structural unit (I). The polymer (A) may have one, or two or more types of each of the block (I), the group (I), the structural unit (I) and the structural unit (II).

Due to containing the polymer (A), the composition for underlayer film formation achieves the superior orientation characteristic for arrangement in the phase separation structure through directed self-assembly, in a directed self-assembly lithography process. Although not necessarily clarified and without wishing to be bound by any theory, the reason for achieving the effects described above due to the composition for underlayer film formation having the aforementioned constitution is inferred as in the following, for example. Specifically, the polymer (A) has, as a terminal structure, an amino group in a structural unit constituting a block in one terminal part of a main chain and/or at one end of the main chain. It is believed that, owing to an interaction of the amino group in the terminal structure with the surface of the substrate, the main chains of the polymer (A) in the underlayer film being formed are arranged more orderly, and eventually a phase separation structure through directed self-assembly has an improved orientation characteristic for arrangement.

The terminal structure of the polymer (A) is represented by, for example, the following formula (1) or (2). The formula (1) represents a preferred example of the block (I) mentioned in the above condition (i), while the formula (2) represents a preferred example of the group (I) mentioned in the above condition (ii).

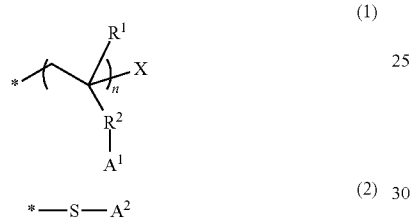

In the above formula (1): $R^1$ represents a hydrogen atom, a fluorine atom or a monovalent organic group having 1 to 20 carbon atoms; $R^2$ represents a single bond, —O—, —COO— or —CONH—; $A^1$ represents a monovalent group that includes an amino group; X represents a hydrogen atom, —SH or —S-$A^{11}$, wherein $A^{11}$ represents a monovalent group that includes an amino group; n is an integer of no less than 2, being number of structural units each represented by (—CH$_2$—C($R^1$)($R^2$-$A^1$)-); and * denotes a bonding site to a moiety other than the terminal structure represented by the above formula (1) in the main chain of the polymer.

In the formula (2): $A^2$ represents a monovalent group that includes an amino group; and * denotes a bonding site to an end of the main chain of the polymer.

The monovalent organic group having 1 to 20 carbon atoms which may be represented by $R^1$ is exemplified by: a monovalent hydrocarbon group having 1 to 20 carbon atoms; a group that includes a divalent hetero atom-containing group between two adjacent carbon atoms of the monovalent hydrocarbon group; a group derived from the monovalent hydrocarbon group or the group that includes a divalent hetero atom-containing group by substituting a part or all of hydrogen atoms included therein with a monovalent hetero atom-containing group; and the like.

The monovalent hydrocarbon group having 1 to 20 carbon atoms is exemplified by a monovalent chain hydrocarbon group having 1 to 20 carbon atoms, monovalent alicyclic hydrocarbon group having 3 to 20 carbon atoms, monovalent aromatic hydrocarbon group having 6 to 20 carbon atoms, and the like.

Exemplary hydrocarbon groups include a chain hydrocarbon group, an alicyclic hydrocarbon group, and an aromatic hydrocarbon group. The "hydrocarbon group" may be either a saturated hydrocarbon group or an unsaturated hydrocarbon group. The "chain hydrocarbon group" as referred to means a hydrocarbon group that is constituted with only a chain structure without including a cyclic structure, and the term "chain hydrocarbon group" includes both linear hydrocarbon groups and branched hydrocarbon groups. The "alicyclic hydrocarbon group" as referred to means a hydrocarbon group that includes as a ring structure not an aromatic ring structure but only an alicyclic structure, and the term "alicyclic hydrocarbon" includes both monocyclic alicyclic hydrocarbon groups and polycyclic alicyclic hydrocarbon groups. However, it is not necessary for the alicyclic hydrocarbon group to be constituted with only an alicyclic structure, and a part thereof may include a chain structure. The "aromatic hydrocarbon group" as referred to means a hydrocarbon group that includes as a ring structure an aromatic ring structure. However, it is not necessary for the aromatic hydrocarbon group to be constituted with only an aromatic ring structure, and a part thereof may include a chain structure or an alicyclic structure.

Examples of the monovalent chain hydrocarbon group having 1 to 20 carbon atoms include:

alkyl groups such as a methyl group, an ethyl group, a n-propyl group and an i-propyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group having 3 to 20 carbon atoms include:

monocyclic alicyclic saturated hydrocarbon groups such as a cyclopentyl group and a cyclohexyl group;

monocyclic alicyclic unsaturated hydrocarbon groups such as a cyclopentenyl group and a cyclohexenyl group;

polycyclic alicyclic saturated hydrocarbon groups such as a norbornyl group, an adamantyl group and a tricyclodecyl group;

polycyclic alicyclic unsaturated hydrocarbon groups such as a norbornenyl group and a tricyclodecenyl group; and the like.

Examples of the monovalent aromatic hydrocarbon group having 6 to 20 carbon atoms include:

aryl groups such as a phenyl group, a tolyl group, a xylyl group, a naphthyl group and an anthryl group;

aralkyl groups such as a benzyl group, a phenethyl group, a naphthylmethyl group and an anthrylmethyl group; and the like.

Examples of the hetero atom constituting the monovalent hetero atom-containing group or the divalent hetero atom-containing group include an oxygen atom, a nitrogen atom, a sulfur atom, a phosphorus atom, a silicon atom, a halogen atom, and the like. Examples of the halogen atom include a fluorine atom, a chlorine atom, a bromine atom, an iodine atom, and the like.

Examples of the divalent hetero atom-containing group include —O—, —CO—, —S—, —CS—, —NR'—, groups obtained by combining at least two of these, and the like. R' represents a hydrogen atom or a monovalent hydrocarbon group.

Examples of the monovalent hetero atom-containing group include a halogen atom, a hydroxy group, a carboxy group, a cyano group, an amino group, a sulfanyl group, and the like.

In light of the copolymerizability of the monomer that gives the structural unit (I), $R^1$ preferably represents a hydrogen atom or a methyl group.

$R^2$ preferably represents a single bond or —COO—.

The lower limit of n representing the number of the structural units (I) in the above formula (1) is typically 2, and preferably 3. The upper limit of n is preferably 20, and more preferably 10. When n falls within the above range, the orientation characteristic for arrangement in a phase separation structure through directed self-assembly is enabled to be more improved.

In the above formula (1), X preferably represents a hydrogen atom.

$A^1$ and $A^{11}$ in the above formula (1) and $A^2$ in the above formula (2) are exemplified by a group represented by the following formula (A), and the like.

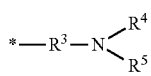

(A)

In the above formula (A), $R^3$ represents a single bond or a divalent hydrocarbon group having 1 to 20 carbon atoms, and $R^4$ and $R^5$ each independently represent: a hydrogen atom; a monovalent hydrocarbon group having 1 to 20 carbon atoms; or a group that includes —O—, —CO—, —NH— or a combination thereof between adjacent carbon atoms of the monovalent hydrocarbon group having 1 to 20 carbon atoms, or at least two of $R^3$, $R^4$ and $R^5$ taken together represent a part of: an aliphatic heterocyclic structure having 3 to 20 ring atoms; or an aromatic heterocyclic structure having 5 to 20 ring atoms, together with the nitrogen atom to which the at least two of $R^3$, $R^4$ and $R^5$ bond.

The divalent hydrocarbon group having 1 to 20 carbon atoms which may be represented by $R^3$ is exemplified by a group obtained by removing one hydrogen atom from the monovalent hydrocarbon group having 1 to 20 carbon atoms, exemplified in connection with $R^1$ in the above formula (1), and the like.

$R^3$ preferably represents a single bond.

The monovalent hydrocarbon group having 1 to 20 carbon atoms which may be represented by $R^4$ or $R^5$ is exemplified by a group similar to the monovalent hydrocarbon group having 1 to 20 carbon atoms, exemplified in connection with $R^1$ in the above formula (1), and the like.

Examples of the group that includes —O—, —CO—, —NH— or a combination thereof between adjacent carbon atoms of the hydrocarbon group which may be represented by $R^4$ or $R^5$ include a methoxymethyl group, a methylcarbonylmethyl group, a methylaminomethyl group, and the like.

The aliphatic heterocyclic structure having 3 to 20 ring atoms represented by at least two of $R^3$, $R^4$ and $R^5$ taken together is exemplified by an azacyclopentane structure, an azacyclohexane structure, an azanorbornane structure, and the like.

The aromatic heterocyclic structure having 5 to 20 ring atoms represented by at least two of $R^3$, $R^4$ and $R^5$ taken together is exemplified by a pyrrole structure, a pyridine structure, a quinoline structure, a pyrimidine structure, a pyrazine structure, an imidazole structure, and the like.

The block (I) and the group (I) are further described hereinafter.

Block (I)

The block (I) is a block of the structural unit (I) situated in one terminal part of the main chain.

Structural Unit (I)

The structural unit (I) includes an amino group.

The amino group is exemplified by a primary amino group, a secondary amino group, a tertiary amino group and the like.

Examples of the secondary amino group include: monosubstituted amino groups such as a methylamino group, an ethylamino group, a cyclohexylamino group and a phenylamino group; —NH—R— (wherein, R represents a divalent organic group); and the like.

Examples of the tertiary amino group include: disubstituted amino groups such as a dimethylamino group, a diethylamino group, a dicyclohexylamino group and a diphenylamino group; trivalent amino groups such as —N=R— (wherein, R represents a trivalent organic group) and —CH$_2$—N(—CH$_2$—)—CH$_2$—; and the like.

The amino group is also exemplified by an amine-derived group having the aforementioned aliphatic heterocyclic structure or aromatic heterocyclic structure.

Of these, in light of improvement of the orientation characteristic for arrangement in the phase separation structure through directed self-assembly, the tertiary amino group and the amine-derived group having the aforementioned aliphatic heterocyclic structure or aromatic heterocyclic structure are preferred, the tertiary amino group is more preferred, a dialkylamino group is still more preferred, and a dimethylamino group is particularly preferred.

A preferred example of the structural unit (I) is a structural unit (hereinafter, may be also referred to as "structural unit (I-1)") represented by the following formula (i).

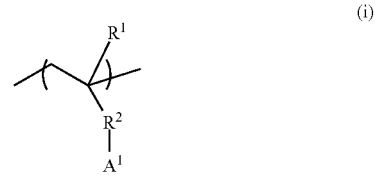

(i)

In the above formula (i), $R^1$, $R^2$ and $A^1$ are as defined in the above formula (1).

Specific examples of the structural unit (I) include structural units represented by the following formulae (1-1) to (1-15) (hereinafter, may be also referred to as "structural units (I-1) to (I-15)"), and the like.

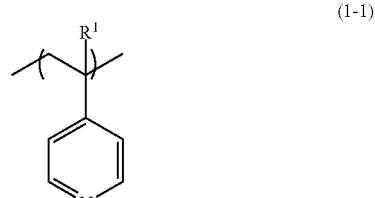

(1-1)

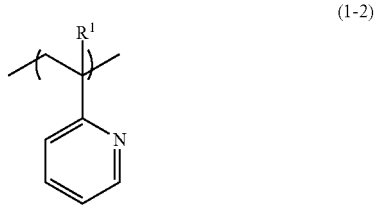

(1-2)

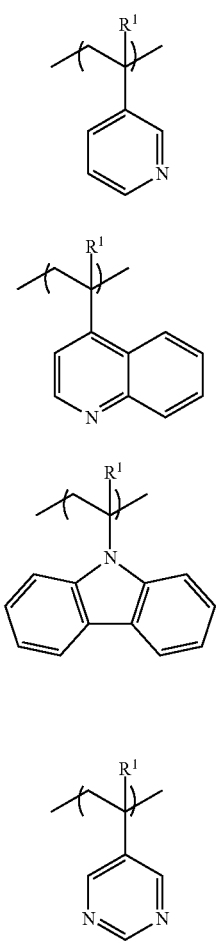
(1-3)
(1-4)
(1-5)
(1-6)
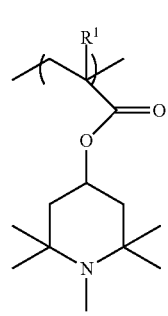
(1-7)
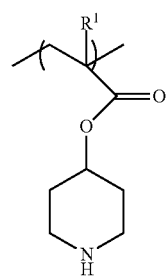
(1-8)
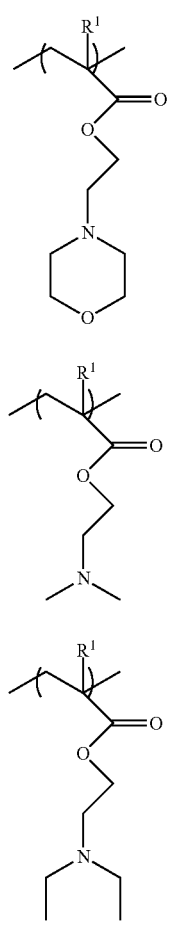
(1-9)
(1-10)
(1-11)
(1-12)
(1-13)

(1-14)

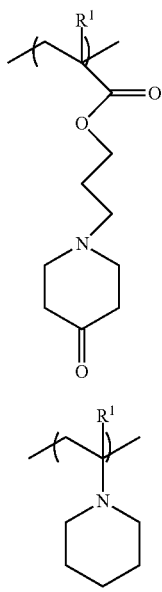

(1-15)

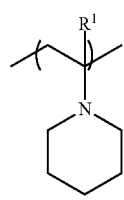

In the above formulae (1-1) to (1-15), $R^1$ is as defined in the above formula (1).

Of these, the structural unit (I-10) is preferred.

In the case in which the polymer (A) has the structural unit (I), the proportion of the structural unit (I) contained with respect to the total structural units constituting the polymer (A) is preferably greater than 0 mol %, more preferably no less than 0.1 mol %, still more preferably no less than 1 mol %, particularly preferably no less than 2 mol %, and more particularly preferably no less than 3 mol %. The upper limit of the proportion of the structural unit (I) contained is preferably 30 mol %, more preferably 20 mol %, still more preferably 10 mol %, particularly preferably 8 mol %, and more particularly preferably 6 mol %. When the proportion of the structural unit (1) contained falls within the above range, the orientation characteristic for arrangement in the phase separation structure through directed self-assembly is enabled to be more improved.

A hydrogen atom, —SH, —S-$A^{11}$, or the like may bond to an end adjacent to the block (I) of the main chain of the polymer (A). $A^{11}$ represents a monovalent group that includes an amino group.

Group (I)

The group (I) is a monovalent group that includes an amino group bonding to the sulfur atom bonding to one end of the main chain.

The group (I) is represented by, for example, the above formula (2). Specific examples of the group (I) include groups represented by the following formulae (2-1) to (2-5), and the like.

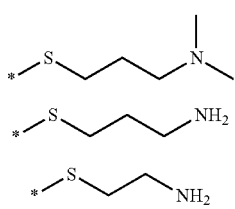

(2-1)

(2-2)

(2-3)

(2-4)

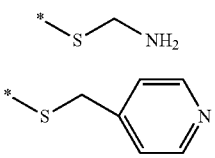

(2-5)

In the above formulae (2-1) to (2-5), * is as defined in the above formula (2).

Structural Unit (II)

The structural unit (II) is different from the structural unit (I). The polymer (A) may have a single type, or a combination of two or more types of the structural unit (II); however, in light of improvement of the orientation characteristic for arrangement in the phase separation structure through directed self-assembly, it is preferred that two or more types of the structural unit (II) are included, and it is more preferred that two types of the structural unit (II) are included. When the two types of the structural unit (II) are the same as two types of structural units included in a block copolymer for constituting the directed self-assembled film to be subjected to phase separation in the directed self-assembly lithography process, the orientation characteristic for arrangement in the phase separation structure through directed self-assembly can be more improved.

In the case in which the polymer (A) has two types of the structural unit (II), it is preferred that the two types of the structural unit (II) are: a structural unit (hereinafter, may be also referred to as "structural unit (II-1)") derived from a first monomer (hereinafter, may be also referred to as "monomer (I)"); and a structural unit (hereinafter, may be also referred to as "structural unit (II-2)") derived from a second monomer (hereinafter, may be also referred to as "monomer (II)") having greater polarity than the monomer (I).

The monomer (I) is exemplified by a vinyl aromatic compound and the like.

Examples of the vinyl aromatic compound include:
styrene;
substituted styrenes such as α-methylstyrene, o-methylstyrene, m-methylstyrene, p-methyl styrene, p-t-butyl styrene, 2,4,6-trim ethyl styrene, p-methoxystyrene, p-t-butoxystyrene, o-vinyl styrene, m-vinyl styrene, p-vinyl styrene, o-hydroxystyrene, m-hydroxy styrene, p-hydroxystyrene, m-chloromethyl styrene, p-chloromethyl styrene, p-chlorostyrene, p-bromostyrene, p-iodostyrene, p-nitrostyrene and p-cyanostyrene;
substituted or unsubstituted vinyl group-containing aromatic hydrocarbons such as vinylnaphthalene, methylvinylnaphthalene and vinylpyrene; and the like.

The monomer (II) is exemplified by (meth)acrylic acid, a (meth)acrylic acid ester, and the like.

Examples of the (meth)acrylic acid ester include:
(meth)acrylic acid alkyl esters such as methyl (meth)acrylate, ethyl (meth)acrylate, t-butyl (meth)acrylate and 2-ethylhexyl (meth)acrylate;
(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;
(meth)acrylic acid substituted alkyl esters such as 2-hydroxyethyl (meth)acrylate, 3-hydroxyadamantyl (meth)acrylate, 3-glycidylpropyl (meth)acrylate and 3-trimethylsilylpropyl (meth)acrylate; and the like.

When the vinyl aromatic compound is used as the monomer (I) and the (meth)acrylic acid or the (meth)acrylic acid ester is used as the monomer (II), the orientation characteristic for arrangement in the phase separation structure through directed self-assembly can be more improved in which, for example, a vinyl aromatic compound-(meth)acrylic acid block copolymer or a vinyl aromatic compound-(meth)acrylic acid ester block copolymer such as a styrene-methyl methacrylate block copolymer is used as a component for forming a directed self-assembled film.

The lower limit of the proportion of the structural unit (II-1) contained with respect to the total structural units constituting the polymer (A) is preferably 10 mol %, more preferably 30 mol %, and still more preferably 40 mol %. The upper limit of the proportion of the structural unit (II-1) contained is preferably 90 mol %, more preferably 80 mol %, and still more preferably 75 mol %.

The lower limit of the proportion of the structural unit (II-2) contained with respect to the total structural units constituting the polymer (A) is preferably 5 mol %, more preferably 10 mol %, and still more preferably 20 mol %. The upper limit of the proportion of the structural unit (II-2) contained is preferably 60 mol %, more preferably 50 mol %, and still more preferably 45 mol %.

When the proportions of the structural unit (II-1) and the structural unit (II-2) contained fall within the above ranges, the orientation characteristic for arrangement in the phase separation structure through directed self-assembly is enabled to be more improved.

The structural unit (II-1) and the structural unit (II-2) may be in either a block sequence or a random sequence, but are preferably in a random sequence. When the structural unit (II-1) and the structural unit (II-2) are in a random sequence, the orientation characteristic for arrangement in the phase separation structure through directed self-assembly is enabled to be more improved.

The lower limit of the proportion of the structural unit (II) contained with respect to the total structural units constituting the polymer (A) is preferably 50 mol %, more preferably 70 mol %, still more preferably 90 mol %, and particularly preferably 93 mol %. The upper limit of the proportion of the structural unit (II) contained is preferably 99.9 mol %, more preferably 99 mol %, still more preferably 98 mol %, and particularly preferably 97 mol %.

The lower limit of the content of the polymer (A) with respect to the total solid content in the composition for underlayer film formation is preferably 70% by mass, more preferably 80% by mass, and still more preferably 90% by mass. The content of the polymer (A) may be 100% by mass. The "total solid content" as referred to in the composition for underlayer film formation means the sum of the components other than the solvent (B). The composition for underlayer film formation may contain one, or two or more types of the polymer (A).

Synthesis Process of Polymer (A)

The polymer (A) satisfies at least one of the following conditions (i) and (ii):

(I) being obtained by anionic polymerization or controlled radical polymerization to allow a block of the structural unit (I) that includes an amino group to bond to one terminal part of a main chain; and (II) being obtained by a click reaction or an SN2 reaction to introduce to one end of a main chain the monovalent group (I) that includes an amino group.

The polymer (A) satisfying the above condition (i) obtained by the production method described in the above condition (I) may be synthesized by, for example: carrying out anionic polymerization or controlled radical polymerization of each monomer that gives the structural unit (II) such as styrene and methyl methacrylate in an appropriate solvent using a RAFT agent, e.g., a trithiocarbonate compound such as 2-cyano-2-propyl dodecyl trithiocarbonate, as well as an anionic polymerization initiator such as sec-BuLi or a radical polymerization initiator such as azobisisobutyronitrile (AIBN); followed by further polymerization carried out by adding a monomer that gives the structural unit (I) such as N,N-dimethylaminoethyl methacrylate.

A trithiocarbonate end of the polymer obtained by the aforementioned synthesis may be transformed into a hydrogen atom end by carrying out a heat treatment by adding tert-thiol such as tert-dodecanethiol and a radical polymerization initiator to the above polymer.

The polymer (A) satisfying the above condition (ii) obtained by the production method described in the above condition (II) may be synthesized by, for example, as described in the synthesis of the polymer (A) satisfying the above condition (i): carrying out polymerization by mixing a RAFT agent, e.g., a trithiocarbonate compound and each monomer that gives the structural unit (II); carrying out amine decomposition of a trithiocarbonate end of the polymer thus obtained, by using a primary or secondary amine; and then carrying out a click reaction with a tertiary amine having a double bond or a triple bond, whereby transformation of the end into an —S— amino group-containing end is allowed. Alternatively, the end may be transformed into the —S— amino group-containing end by carrying out an SN2 reaction of a halogenated alkane having a tertiary amino group with an amine-decomposed trithiocarbonate end in the presence of a base.

The lower limit of the number average molecular weight (Mn) of the polymer (A) as determined by gel permeation chromatography (GPC) is preferably 1,000, more preferably 3,000, and still more preferably 5,000. Meanwhile, the upper limit of the Mn is preferably 50,000, more preferably 20,000, and still more preferably 10,000.

The upper limit of the ratio (Mw/Mn) of the polystyrene equivalent weight average molecular weight (Mw) to Mn of the polymer (A) is preferably 5, more preferably 2, still more preferably 1.5, and particularly preferably 1.3. The lower limit of Mw/Mn is typically 1, and preferably 1.1.

When Mn and Mw/Mn of the polymer (A) fall within the above ranges, the orientation characteristic for arrangement in a phase separation structure through directed self-assembly is enabled to be more improved.

(B) Solvent

The solvent (B) is not particularly limited as long as it is a solvent capable of dissolving or dispersing at least the polymer (A), as well as optional component(s) contained as needed.

The solvent (B) is exemplified by an alcohol solvent, an ether solvent, a ketone solvent, an amide solvent, an ester solvent, a hydrocarbon solvent, and the like. Two or more types of the solvent (B) may be used in combination.

Examples of the alcohol solvent include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

C3-19 polyhydric alcohol partial ether solvents such as propylene glycol monomethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methyl acetamide, N,N-dimethyl acetamide and N-methylpropionamide; and the like.

Examples of the ester solvent include:

acetic ester solvents such as n-butyl acetate;

monocarboxylic acid ester solvents, e.g., lactic acid solvents such as ethyl lactate and butyl lactate;

polyhydric alcohol carboxylate solvents such as propylene glycol acetate;

polyhydric alcohol partial ether carboxylate solvents such as propylene glycol monomethyl ether acetate;

polyhydric carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, the ester solvent is preferred, the polyhydric alcohol partially etherated carboxylate solvent and/or the lactic acid ester solvent is/are more preferred, and propylene glycol monomethyl ether acetate and/or ethyl lactate is/are still more preferred.

Optional Component

The optional component(s) is/are exemplified by a surfactant, a crosslinking agent and the like. The surfactant is capable of improving the application properties of the composition for underlayer film formation. When the crosslinking agent is contained, a crosslinking reaction takes place between the crosslinking agent and the polymer (A), whereby heat resistance of the underlayer film to be formed is enabled to be improved.

Preparation Process of Composition for Underlayer Film Formation

The composition for underlayer film formation may be prepared by, for example, mixing the polymer (A), the solvent (B) and as needed, the optional component at a certain ratio, and preferably filtering the obtained mixture through, for example, a filter or the like having a pore size of about 0.45 µm. The lower limit of the solid content concentration of the composition for underlayer film formation is preferably 0.1% by mass, more preferably 0.5% by mass, still more preferably 0.8% by mass, and particularly preferably 1% by mass. The upper limit of the solid content concentration of the composition for underlayer film formation is preferably 50% by mass, more preferably 30% by mass, still more preferably 10% by mass, and particularly preferably 5% by mass.

Directed Self-Assembly Lithography Process

The term "directed self-assembling" or "directed self-assembly" as referred to means a phenomenon of spontaneously constructing a tissue or a structure without resulting from only the control from an external factor. In the embodiment of the present invention, a pattern (miniaturized pattern) may be formed by, for example: forming a film (directed self-assembled film) having a phase separation structure through directed self-assembly, by e.g., applying a composition for use in formation of a directed self-assembled film on an underlayer film formed from a specific composition for underlayer film formation; and then removing a part of a plurality of phases of the directed self-assembled film.

The directed self-assembly lithography process includes: providing an underlayer film directly or indirectly on an upper face side of a substrate by using the composition for underlayer film formation of the embodiment (hereinafter, may be also referred to as "underlayer film-providing step"); applying the composition for use in formation of a directed self-assembled film on the upper face side of the underlayer film (hereinafter, may be also referred to as "applying step"); allowing phase separation of a coating film provided after the applying step (hereinafter, may be also referred to as "phase separation step"); removing at least a part of a plurality of phases of the directed self-assembled film obtained after the phase separation step (hereinafter, may be also referred to as "removing step"); and etching the substrate using a miniaturized pattern formed after the removing step (hereinafter, may be also referred to as "etching step").

It is preferred that the directed self-assembly lithography process further includes, prior to the applying step, forming a prepattern on the upper face side of the underlayer film or the substrate (hereinafter, may be also referred to as "prepattern-forming step"). In this case, recessed portions of the prepattern are filled with the composition for use in formation of a directed self-assembled film in the applying step.

Each step will be explained hereinafter with reference to the drawings.

Underlayer Film-Providing Step

In this step, the underlayer film is provided directly or indirectly on the upper face side of the substrate by using the composition for underlayer film formation of the embodiment. Accordingly, a substrate with an underlayer is obtained in which an underlayer film 102 is formed on the substrate 101 as shown in FIG. 1. The directed self-assembled film is to be formed on the underlayer film 102. Upon formation of the phase separation structure (micro domain structure) of the directed self-assembled film, in addition to an interaction between/among components constituting the directed self-assembled film, an interaction between these components and the underlayer film 102 is believed to be effective, whereby control of the phase separation structure is enabled and eventually the orientation characteristic for arrangement in a phase separation structure through directed self-assembly is enabled to be superior.

As the substrate 101, a conventionally well-known substrate such as, for example, a silicon wafer, a wafer coated with aluminum, or the like may be used. The underlayer film 102 may be formed by providing a coating film on the substrate 101 through application by a well-known procedure such as spin coating, and then hardening the coating film through heating and/or exposure. The radioactive ray for use in the exposure is exemplified by a visible light ray, an ultraviolet ray, a far ultraviolet ray, an X-ray, an electron beam, a γ-ray, a molecular beam, an ion beam, and the like.

Conditions for formation of the underlayer film involve the followings. The lower limit of a heating temperature for the coating film is preferably 100° C., more preferably 120° C., still more preferably 150° C., and particularly preferably 180° C. The upper limit of the heating temperature is preferably 400° C., more preferably 300° C., still more preferably 240° C., and particularly preferably 220° C. The lower limit of a heating time period for the coating film is preferably 10 sec, more preferably 15 sec, and still more preferably 30 sec. The upper limit of the heating time period is preferably 30 min, more preferably 10 min, and still more preferably 5 min. When the heating temperature and the heating time period for formation of the underlayer film fall within the above ranges, the underlayer film is enabled to be readily and reliably formed. The heating of the coating film may be conducted in either an air atmosphere or an inert gas atmosphere such as a nitrogen gas atmosphere.

The lower limit of an average thickness of the underlayer film 102 is preferably 5 nm, more preferably 10 nm, still more preferably 15 nm, and particularly preferably 20 nm. The upper limit of the average thickness of the underlayer film 102 is preferably 20,000 nm, more preferably 1,000 nm, still more preferably 500 nm, and particularly preferably 100 nm.

The lower limit of a static contact angle of pure water on a surface of the underlayer film 102 is preferably 60°, more preferably 70°, and still more preferably 75°. The upper limit of the static contact angle of pure water is preferably 95°, more preferably 90°, and still more preferably 85°. When the static contact angle of pure water on the surface of the underlayer film falls within the above range, the orientation characteristic for arrangement in a phase separation structure through directed self-assembly is enabled to be more improved.

Prepattern-Forming Step

This step may be carried out either before or after the underlayer film-providing step, but preferably after the underlayer film-providing step. In this step, a prepattern is formed on the upper face side of the underlayer film or the substrate. It is preferred that a prepattern 103 is formed on the underlayer film 102 by using a composition for prepattern formation, as illustrated in FIG. 2. The prepattern 103 is provided for the purpose of controlling phase separation in formation of the directed self-assembled film, thereby enabling a phase separation structure through directed self-assembly to be more favorably formed. More specifically, among the components for forming the directed self-assembled film, the components having a higher affinity to a lateral face of the prepattern form phases along the prepattern, whereas the components having a lower affinity to the same form phases at positions away from the prepattern. Accordingly, a phase separation structure through directed self-assembly can be more clearly formed. In addition, according to qualities of the material, length, thickness, shape, etc. of the prepattern, the formed phase separation structure can be more minutely controlled. It is to be noted that a shape of the prepattern may be appropriately selected depending on the pattern intended to be finally formed, and, for example, a line-and-space pattern, a hole pattern, a pillar pattern, and the like may be employed.

As the procedure for forming the prepattern 103, those similar to well-known resist pattern-forming methods, and the like may be employed. In addition, a conventional composition for resist film formation may be used as the composition for prepattern formation. In a specific method for formation of the prepattern 103, for example, a chemical amplification resist composition such as "AEX1191JN" (ArF immersion resist) available from JSR Corporation is applied on the underlayer film 102 to provide a resist film. Next, an exposure is carried out by irradiating a desired region of the resist film with a radioactive ray through a mask having a specific pattern. Examples of the radioactive ray include: electromagnetic waves such as ultraviolet rays, far ultraviolet rays and X-rays; charged particle rays such as electron beams; and the like. Of these, far ultraviolet rays are preferred, and an ArF excimer laser beam or a KrF excimer laser beam is more preferred. Subsequently, post exposure baking (PEB) is carried out, followed by development using a developer solution such as an alkaline developer solution, whereby a desired prepattern 103 can be formed.

It is to be noted that the surface of the prepattern 103 may be subjected to a hydrophobilization treatment or a hydrophilization treatment. A specific treatment procedure may be exemplified by e.g., a hydrogenation treatment including an exposure to hydrogen plasma for a certain time period. An increase of the hydrophilicity of the surface of the prepattern 103 enables the aforementioned directed self-assembly to be accelerated.

Applying Step

In this step, the composition for use in formation of a directed self-assembled film is applied on the upper face side of the underlayer film.

The composition for use in formation of a directed self-assembled film is exemplified by a composition obtained by dissolving in a solvent, etc. a component capable of forming the phase separation structure through directed self-assembly.

Examples of the component capable of forming the phase separation structure through directed self-assembly include a block copolymer, a mixture of two or more polymers that are incompatible with each other, and the like. Of these, from the perspective that a clearer phase separation structure is enabled to be formed, the block copolymer is preferred, a block copolymer constituted of a styrene unit and a methacrylic acid ester unit is more preferred, and a diblock copolymer constituted of a styrene unit and a methyl methacrylate unit is still more preferred.

The applying procedure of the composition for use in formation of a directed self-assembled film is exemplified by spin coating and the like. As illustrated in FIG. 3, the composition for use in formation of a directed self-assembled film is applied between walls of the prepattern 103 on the underlayer film 102, whereby a coating film 104 is provided.

Phase Separation Step

In this step, phase separation of the coating film provided after the applying step is allowed. Accordingly, the directed self-assembled film is formed.

During the phase separation of the coating film 104 of the composition for use in formation of a directed self-assembled film, directed self-assembly as generally referred to, in which sites having the same property gather to spontaneously form an ordered pattern, can be accelerated by carrying out annealing, etc. Accordingly, the phase separation structure is provided on the underlayer film 102 as shown in FIG. 4. It is preferred that the phase separation structure is formed along the prepattern, and it is more preferred that interfaces provided through the phase separation are substantially horizontal to the lateral faces of the prepattern. For example, in the case of the prepattern 103 being a line pattern, a phase 105b of a component etc. having a higher affinity to the prepattern 103 is formed along the prepattern 103, while a phase 105a of other component etc. is formed in a farthest part from the lateral face of the prepattern, i.e., a central part of a region surrounded by the prepattern, whereby a lamellar phase separation structure is formed in which lamellar phases are alternately arranged. In the case of the prepattern being a hole pattern, a phase of a component etc. having a higher affinity to the prepattern is formed along a lateral face of a hole of the prepattern, while a phase of other component etc. is formed in a central part of the hole. In the case of the prepattern being a pillar pattern, a phase of a component etc. having a higher affinity to the prepattern is formed along a lateral face of a pillar of the prepattern, while a phase of other component etc. is formed in a part away from each pillar. By appropriately adjusting: a distance between the pillars in the prepattern; a structure and a blending ratio of the components such as polymers in the directed self-assembling composition; and the like, a desired phase separation structure is enabled to be provided. It is to be noted that, although the phase separation structure provided in this step includes a plurality of phases, and interfaces provided by these phases are typically substantially perpendicular, the interfaces may not necessarily be definite. Precisely controlling the phase separation structure to be obtained by way of the structure and the blending ratio of the polymers, and the prepattern, in addition to the underlayer film, enables a desired fine pattern to be obtained.

The annealing procedure is exemplified by heating with an oven, a hot plate, etc. and the like. The lower limit of a temperature for the heating is preferably 80° C., and more preferably 100° C. The upper limit of the temperature for the heating is preferably 400° C., and more preferably 300° C. The lower limit of the annealing time period is preferably 10 sec, and more preferably 30 sec. The upper limit of the annealing time period is preferably 120 min, and more preferably 60 min. The lower limit of the average thickness of the directed self-assembled film 105 obtained is preferably 0.1 nm, and more preferably 0.5 nm. The upper limit of the average thickness is preferably 500 nm, and more preferably 100 nm.

Removing Step

In this step, at least a part of a plurality of phases of the directed self-assembled film obtained after the phase separation is removed. A miniaturized pattern is thereby formed.

Using the difference in the etching rate, etc. of each phase generated by phase separation through the directed self-assembly, the prepattern 103 and/or a part of the phases 105a can be removed by the etching treatment. A state attained after removing the part of the phases 105a in the phase separation structure, and the prepattern 103 is illustrated in FIG. 5.

As the removing procedure of the part of the phases 105a in the phase separation structure included in the directed self-assembled film 105, or the prepattern 103, well-known procedures e.g., reactive ion etching (RIE) such as chemical dry etching and chemical wet etching; physical etching such as sputter etching and ion beam etching; and the like may be exemplified. Of these, reactive ion etching (RIE) is preferred, and chemical dry etching carried out by using a $CF_4$ gas, an $O_2$ gas or the like, and chemical wet etching (wet development) carried out by using an etching solution such as an organic solvent, e.g., methyl isobutyl ketone (MIBK) and 2-propanol (IPA), or hydrofluoric acid are more preferred.

Etching Step

In this step, the substrate is etched using a miniaturized pattern formed after the removing step. A substrate pattern is thus enabled to be formed.

Patterning onto the substrate is enabled by etching the underlayer film and the substrate using as a mask the miniaturized pattern constituted of other part of the phases 105b of the directed self-assembled film remaining after the removing step. After completion of the patterning onto the substrate, the phases used as the mask are removed from the substrate by a dissolving treatment or the like, whereby a substrate pattern (patterned substrate) can be finally obtained. The pattern thus obtained is exemplified by a line-and-space pattern, a hole pattern, and the like. For the etching, the procedure similar to those exemplified in connection with the removing step may be employed. Of these, dry etching is preferred. A gas to be used in the dry etching may be appropriately selected in accordance with a material of the substrate. For example, in a case where the substrate is a silicon material, a gas mixture of chlorofluorocarbon-containing gas and $SF_4$, or the like may be used. In a case in which the substrate is a metallic film, a gas mixture of $BCl_3$ and $Cl_2$ or the like may be used.

The pattern obtained by the directed self-assembly lithography process is suitably used for semiconductor elements and the like, and further the semiconductor elements are widely used for LEDs, solar cells, and the like.

EXAMPLES

Hereinafter, the present invention is explained in detail by way of Examples, but the present invention is not limited to these Examples. The compounds mentioned in the Examples below were commercially available reagents, unless otherwise specified particularly. Measuring methods for various types of physical properties are shown below.

Weight Average Molecular Weight (Mw) and Number Average Molecular Weight (Mn)

Mw and Mn were determined by gel permeation chromatography (GPC) using GPC columns ("G2000 HXL"×2, "G3000 HXL"×1, and "G4000 HXL"×1 available from Tosoh Corporation) and mono-dispersed polystyrene as a standard, under analytical conditions involving a flow rate of 1.0 mL/min, an elution solvent of tetrahydrofuran and a column temperature of 40° C.

$^{13}$C-NMR Analysis $^{13}$C-NMR analysis was carried out using "JNM-EX400" available from JEOL, Ltd., with DMSO-$d_6$ for use as a solvent for measurement. The proportion of each structural unit was calculated from the area ratio of the peak corresponding to each structural unit in the spectrum obtained by the $^{13}$C-NMR analysis.

Synthesis of Polymer (A)

Synthesis Example 1

Into a 200-mL three-neck flask were added 0.69 g of 2-cyano-2-propyl dodecyl trithiocarbonate (2 mmol), 0.098 g of azobisisobutyronitrile (AIBN) (0.6 mmol), 17.5 g of styrene (168 mmol), 6.00 g of methyl methacrylate (60 mmol) and 40 g of anisole, and the mixture was heated while stirring under nitrogen at 80° C. for 5 hrs. Subsequently, 2.01 mL of N,N-dimethylaminoethyl methacrylate (12 mmol)

was added thereto with a syringe, 0.098 g of AIBN (0.6 mmol) was further added thereto, and the mixture was heated while stirring under nitrogen at 80° C. for 3 hrs.

The resulting polymerization reaction liquid was charged into 500 g of methanol to permit purification through precipitation. The precipitate thus obtained was dissolved in 20 g of propylene glycol monomethyl ether acetate (PG-MEA), and then 0.49 g of AIBN (3 mmol), 2.03 g of tert-dodecanethiol (5 mmol) and 1 g of propylene glycol monomethyl ether (PGME) were added thereto. The mixture was heated while stirring under nitrogen at 90° C. for 2 hrs.

The resulting reaction liquid was concentrated and then diluted with 10 g of tetrahydrofuran (THF). The diluted solution was charged into 500 g of methanol to permit purification through precipitation. A light-yellow solid thus obtained was dried under reduced pressure to give 18.6 g of a polymer represented by the following formula (A-1). The polymer (A-1) had Mn of 6,060, Mw of 7,300, and Mw/Mn of 1.20. The proportion of each structural unit contained in the polymer (A-1) as estimated by the $^{13}$C-NMR analysis was as specified in the following formula (A-1).

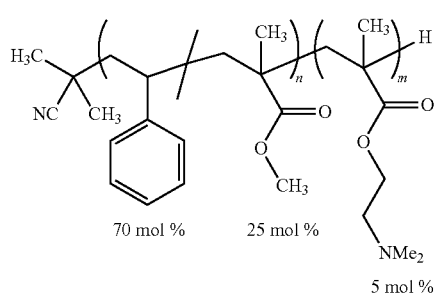

Synthesis Example 2

Into a 200-mL three-neck flask were added 0.69 g of 2-cyano-2-propyl dodecyl trithiocarbonate (2 mmol), 0.098 g of AIBN (0.6 mmol), 16.3 g of styrene (156 mmol), 7.21 g of methyl methacrylate (72 mmol) and 40 g of anisole, and the mixture was heated while stirring under nitrogen at 80° C. for 5 hrs. Subsequently, 2.01 mL of N,N-dimethylaminoethyl methacrylate (12 mmol) was added thereto with a syringe, 0.098 g of AIBN (0.6 mmol) was further added thereto, and the mixture was heated while stirring under nitrogen at 80° C. for 3 hrs.

The resulting polymerization reaction liquid was charged into 500 g of methanol to permit purification through precipitation. The precipitate thus obtained was dissolved in 20 g of PGMEA, and then 0.49 g of AIBN (3 mmol), 2.03 g of tert-dodecanethiol (5 mmol) and 1 g of PGME were added thereto. The mixture was heated while stirring under nitrogen at 90° C. for 2 hrs.

The resulting reaction liquid was concentrated and then diluted with 10 g of THF. The diluted solution was charged into 500 g of methanol to permit purification through precipitation. A light-yellow solid thus obtained was dried under reduced pressure to give 18.1 g of a polymer represented by the following formula (A-2). The polymer (A-2) had Mn of 6,500, Mw of 7,800, and Mw/Mn of 1.20. The proportion of each structural unit contained in the polymer (A-2) as estimated by the $^{13}$C-NMR analysis was as specified in the following formula (A-2).

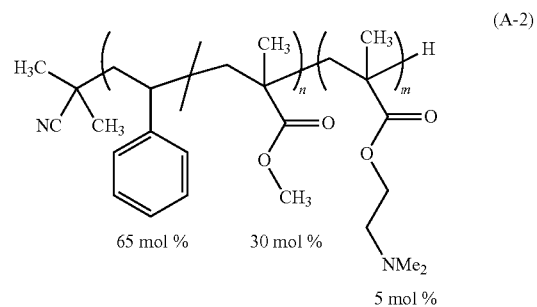

Synthesis Example 3

Into a 200-mL three-neck flask were added 0.69 g of 2-cyano-2-propyl dodecyl trithiocarbonate (2 mmol), 0.098 g of AIBN (0.6 mmol), 13.8 g of styrene (132 mmol), 9.60 g of methyl methacrylate (96 mmol) and 40 g of anisole, and the mixture was heated while stirring under nitrogen at 80° C. for 5 hrs. Subsequently, 2.01 mL of N,N-dimethylaminoethyl methacrylate (12 mmol) was added thereto with a syringe, 0.098 g of AIBN (0.6 mmol) was further added thereto, and the mixture was heated while stirring under nitrogen at 80° C. for 3 hrs.

The resulting polymerization reaction liquid was charged into 500 g of methanol to permit purification through precipitation. The precipitate thus obtained was dissolved in 20 g of PGMEA, and then 0.49 g of AIBN (3 mmol), 2.03 g of tert-dodecanethiol (5 mmol) and 1 g of PGME were added thereto. The mixture was heated while stirring under nitrogen at 90° C. for 2 hrs.

The resulting reaction liquid was concentrated and then diluted with 10 g of THF. The diluted solution was charged into 500 g of methanol to permit purification through precipitation. A light-yellow solid thus obtained was dried under reduced pressure to give 18.1 g of a polymer represented by the following formula (A-3). The polymer (A-3) had Mn of 6,500, Mw of 8,300, and Mw/Mn of 1.27. The proportion of each structural unit contained in the polymer (A-3) as estimated by the $^{13}$C-NMR analysis was as specified in the following formula (A-3).

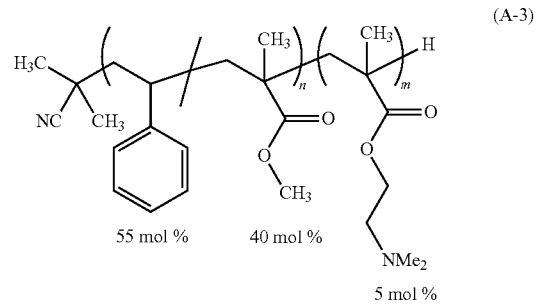

Synthesis Example 4

Into a 200-mL three-neck flask were added 0.69 g of 2-cyano-2-propyl dodecyl trithiocarbonate (2 mmol), 0.098 g of AIBN (0.6 mmol), 7.50 g of styrene (72 mmol), 15.6 g of methyl methacrylate (156 mmol) and 40 g of anisole, and the mixture was heated while stirring under nitrogen at 80°

C. for 5 hrs. Subsequently, 2.01 mL of N,N-dimethylaminoethyl methacrylate (12 mmol) was added thereto with a syringe, 0.098 g of AIBN (0.6 mmol) was further added thereto, and the mixture was heated while stirring under nitrogen at 80° C. for 3 hrs.

The resulting polymerization reaction liquid was charged into 500 g of methanol to permit purification through precipitation. The precipitate thus obtained was dissolved in 20 g of PGMEA, and then 0.49 g of AIBN (3 mmol), 2.03 g of tert-dodecanethiol (5 mmol) and 1 g of PGME were added thereto. The mixture was heated while stirring under nitrogen at 90° C. for 2 hrs.

The resulting reaction liquid was concentrated and then diluted with 10 g of THF. The diluted solution was charged into 500 g of methanol to permit purification through precipitation. A light-yellow solid thus obtained was dried under reduced pressure to give 18.2 g of a polymer represented by the following formula (A-4). The polymer (A-4) had Mn of 6,800, Mw of 8,300, and Mw/Mn of 1.22. The proportion of each structural unit contained in the polymer (A-4) as estimated by the $^{13}$C-NMR analysis was as specified in the following formula (A-4).

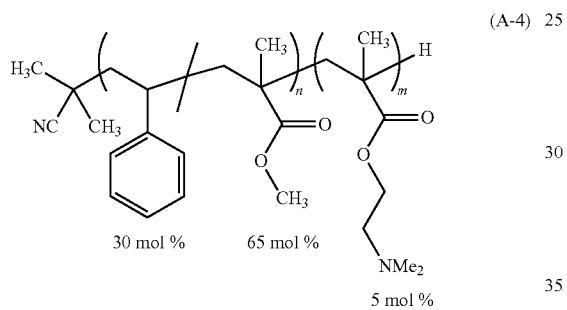

(A-4)

The resulting reaction liquid was concentrated and then diluted with 10 g of THF. The diluted solution was charged into 200 g of methanol to permit purification through precipitation. A light-yellow solid thus obtained was dried under reduced pressure to give 3.6 g of a polymer represented by the following formula (A-5). The polymer (A-5) had Mn of 6,240, Mw of 7,500, and Mw/Mn of 1.20.

The proportion of each structural unit contained in the polymer (A-5) as estimated by the $^{13}$C-NMR analysis was as specified in the following formula (A-5).

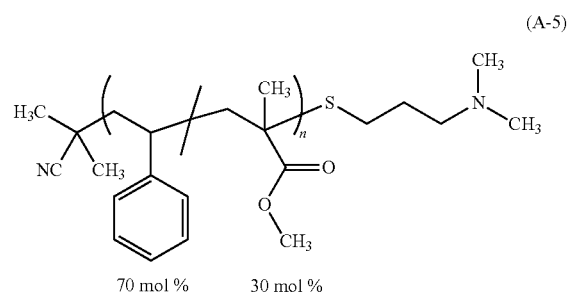

(A-5)

Synthesis Example 6

Into a 200-mL three-neck flask were added 0.69 g of 2-cyano-2-propyl dodecyl trithiocarbonate (2 mmol), 0.098 g of AIBN (0.6 mmol), 7.50 g of styrene (72 mmol), 15.6 g of methyl methacrylate (156 mmol) and 40 g of anisole, and the mixture was heated while stirring under nitrogen at 80° C. for 5 hrs. Subsequently, 0.098 g of AIBN (0.6 mmol) was added thereto, and the mixture was heated while stirring under nitrogen at 80° C. for 3 hrs.

The resulting polymerization reaction liquid was charged into 500 g of methanol to permit purification through precipitation. The precipitate thus obtained was dissolved in 20 g of PGMEA, and then 0.49 g of AIBN (3 mmol), 2.03 g of tert-dodecanethiol (5 mmol) and 1 g of PGME were added thereto. The mixture was heated while stirring under nitrogen at 90° C. for 2 hrs.

Synthesis Example 5

Into a 200-mL three-neck flask were added 0.69 g of 2-cyano-2-propyl dodecyl trithiocarbonate (2 mmol), 0.098 g of azobisisobutyronitrile (AIBN) (0.6 mmol), 17.5 g of styrene (168 mmol), 6.00 g of methyl methacrylate (60 mmol) and 40 g of anisole, and the mixture was heated while stirring under nitrogen at 80° C. for 5 hrs. Subsequently, 0.098 g of AIBN (0.6 mmol) was added thereto, and the mixture was heated while stirring under nitrogen at 80° C. for 3 hrs.

The resulting polymerization reaction liquid was charged into 500 g of methanol to permit purification through precipitation. The precipitate thus obtained was dissolved in 20 g of PGMEA, and then 0.73 g of n-butylamine (10 mmol) and 1 g of PGME were added thereto. The mixture was heated while stirring under nitrogen at 50° C. for 2 hrs.

The resulting reaction liquid was concentrated and then diluted with 10 g of THF. The diluted solution was charged into 500 g of methanol to permit purification through precipitation. A light-yellow solid thus obtained was dried under reduced pressure to give 18.6 g of a polymer (a-5) having a —SH group at the end of the main chain. The polymer (a-5) had Mn of 6,060, Mw of 7,300, and Mw/Mn of 1.20.

Next, to 4 g of the polymer (a-5) were added 0.68 g of N,N-dimethylallylamine (8 mmol), 10 g of PGMEA and 0.164 g of AIBN (1 mmol). The mixture was heated while stirring under nitrogen at 60° C. for 5 hrs.

The resulting reaction liquid was concentrated and then diluted with 10 g of THF. The diluted solution was charged into 500 g of methanol to permit purification through precipitation. A light-yellow solid thus obtained was dried under reduced pressure to give 18.0 g of a polymer represented by the following formula (a-1). The polymer (a-1) had Mn of 6,500, Mw of 8,000, and Mw/Mn of 1.23. The proportion of each structural unit contained in the polymer (a-1) as estimated by the $^{13}$C-NMR analysis was as specified in the following formula (a-1).

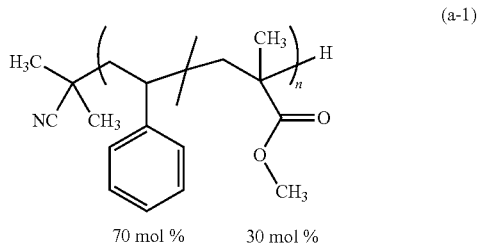

(a-1)

Preparation of Composition for Underlayer Film Formation

The solvent (B) used in the preparation of the composition for underlayer film formation is shown below.

(B) Solvent
B-1: propylene glycol monomethyl ether acetate
B-2: ethyl lactate

Example 1

A composition for underlayer film formation (S-1) was prepared by adding 98.8 g of (B-1) as the solvent (B) to 1.2 g of (A-1) as the polymer (A), stirring the mixture, and then filtering the mixture through a high-density polyethylene filter having a pore size of 0.45 µm.

Examples 2 to 6 and Comparative Example 1

Compositions for underlayer film formation (S-2) to (S-7) were prepared similarly to Example 1 except that the type and the content of each component used were as shown in Table 1 below.

TABLE 1

| Amount (g) | | | Example | | | | | | Comparative Example |
|---|---|---|---|---|---|---|---|---|---|
| | | | 1 | 2 | 3 | 4 | 5 | 6 | 1 |
| Composition for underlayer film formation | | | S-1 | S-2 | S-3 | S-4 | S-5 | S-6 | S-7 |
| (A) Polymer | A-1 | | 1.2 | 1.2 | | | | | |
| | A-2 | | | | 1.2 | | | | |
| | A-3 | | | | | 1.2 | | | |
| | A-4 | | | | | | 1.2 | | |
| | A-5 | | | | | | | 1.2 | |
| | a-1 | | | | | | | | 1.2 |
| (B) Solvent | B-1 | | 98.8 | 80 | 98.8 | 80 | 98.8 | 98.8 | 98.8 |
| | B-2 | | | 18.8 | | 18.8 | | | |

Directed Self-Assembly Lithography Process

Examples 7 to 14 and Comparative Example 2

After an underlayer film was formed together with a prepattern on a surface of a substrate by using the composition for underlayer film formation obtained as described above, a composition for use in formation of a directed self-assembled film was applied thereon. A directed self-assembled film was formed by allowing phase separation of the coating film thus obtained.

Prepattern Formation

A spin-on-glass material ("NFC ISX568" available from JSR Corporation) was applied in a thickness of 40 nm on a 300-mm wafer by using "Clean Track-12" available from Tokyo Electron Limited, and then baked under nitrogen at 220° C. for 90 sec. Next, a polystyrene brush ("NFC DS1001Y" available from JSR Corporation) was applied in a thickness of 30 nm on SiARC thus formed, and baked at 250° C. for 3 min. The brush thus formed was rinsed with PGMEA to remove an unreacted material. Subsequently, an ArF immersion resist ("AEX1191JN" available from JSR Corporation) was applied thereon in a thickness of 50 nm, and then subjected to: prebaking at 100° C. for 1 min; exposure by an exposure device ("XT1950i Scanner" available from ASML (NA: 1.35, dipole illuminance σou/σin: 0.76/0.66)); and post exposure baking at 100° C. for 1 min. Development with butyl acetate was conducted for 30 sec to produce an LS pattern with a pitch of 90 nm.

In order to remove the resist pattern, the wafer was etched with oxygen/argon plasma (apparatus used: "NZ-1300" available from ULVAC, Inc., electric power supply: MW (microwave power supply), degree of vacuum: 50 mtorr, 15 sec/$O_2$, 100 secm/Ar, power: 50 W) to form a trench by etching.

Next, etching for a resist pattern was carried out by using "A RIE-1701 Reactive Ion Etch Plasma" available from Nordson MARCH. Thereafter, in order to remove the resist material completely, the wafer was immersed in RSD-001 at a normal temperature for 15 min, rinsed with PGMEA, and blown with air to give a wafer with a prepattern formed thereon.

Underlayer Film Providing

An underlayer film was formed in the trench by: applying the composition for underlayer film formation prepared as described above in a thickness of 30 nm on the wafer with the prepattern thus obtained; and carrying out a heat treatment at 200° C. for 3 min, followed by rinsing with PGMEA and air blowing.

Directed Self-Assembled Film Formation

As the composition for use in formation of a directed self-assembled film, the composition (T-1) (blend of PS-block-PMMA 31 nm P_LS and PS-block-PMMA 29.0 nm P_LS, blending ratio (by mass): 50/50) or the composition (T-2) (PS-block-PMMA 30 nm P_LS single) was applied in a thickness of 35 nm. The coating film was subjected to heat annealing at 250° C. for 5 min under nitrogen to allow phase separation. A directed self-assembled film was thus formed.

Evaluations

A state of orientation of arrangement was observed by using "CG-6300" available from Hitachi High-Technologies Corporation, and a pitch size (LO) was measured. The pitch analysis was conducted on the basis of Freq analyzer DSA produced by IMEC based on MATLAB2017b. The orientation characteristic for arrangement was evaluated to be "A" (favorable) when oriented arrangement was observed, and "B" (unfavorable) when a fingerprint pattern and the pattern were not observed. The symbol "-" for the composition for use in formation of a directed self-assembled film of Comparative Example 2 in Table 2 indicates that formation of a directed self-assembled film using a composition for use in formation of a directed self-assembled film was not carried out since no fingerprint pattern was observed.

TABLE 2

| | Composition for use in formation of directed self-assembled film | Composition for underlayer film formation | Orientation characteristic for arrangement | L0 (nm) |
|---|---|---|---|---|
| Example 7 | T-1 | S-1 | A | 30 |
| Example 8 | T-1 | S-2 | A | 29.9 |
| Example 9 | T-1 | S-3 | A | 29.9 |
| Example 10 | T-1 | S-4 | A | 30 |
| Example 11 | T-1 | S-5 | A | 30 |
| Example 12 | T-1 | S-6 | A | 29.9 |
| Example 13 | T-2 | S-1 | A | 29.9 |
| Example 14 | T-2 | S-2 | A | 29.9 |
| Comparative Example 2 | — | S-7 | B | No pattern |

As is clear from the results shown in Table 2, the compositions for underlayer film formation of Examples were capable of providing the superior orientation characteristic for arrangement in a phase separation structure through directed self-assembly. On the other hand, the composition for underlayer film formation of Comparative Example was not capable of forming a pattern.

The composition for underlayer film formation and the underlayer film for directed self-assembled film in a directed self-assembly lithography process of the embodiments of the present invention enable a phase separation structure being superior in orientation characteristic for arrangement to be formed by directed self-assembly. The forming method of the underlayer film of the embodiment of the present invention enables the underlayer film of the aforementioned embodiment to be readily and reliably formed. The directed self-assembly lithography process of the embodiment of the present invention enables a favorable pattern to be formed by using a phase separation structure, through directed self-assembly, that is superior in orientation characteristic for arrangement. Therefore, these can be suitably used in a lithography process in manufacture of various types of electronic devices such as a semiconductor device and a liquid crystal device, in which further progress of miniaturization is demanded.

Obviously, numerous modifications and variations of the present invention are possible in light of the above teachings. It is therefore to be understood that within the scope of the appended claims, the invention may be practiced otherwise than as specifically described herein.

What is claimed is:
1. A composition, comprising:
a polymer; and
a solvent,
wherein
the polymer comprises a terminal structure represented by formula (1):

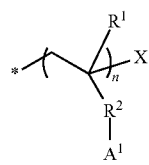

(1)

wherein, in the formula (1):
$R^1$ represents a hydrogen atom, a fluorine atom or a monovalent organic group having 1 to 20 carbon atoms;
$R^2$ represents a single bond, —O—, —COO— or —CONH—;
$A^1$ represents a monovalent group comprising an amino group;
X represents a hydrogen atom, —SH or —S—$A^{11}$, wherein $A^{11}$ represents a monovalent group comprising an amino group;
n is an integer of no less than 2, being number of structural units each represented by (—$CH_2$—$C(R^1)$ ($R^2$-$A^1$)-); and
* denotes a bonding site to a moiety other than the terminal structure represented by the formula (1) in the main chain of the polymer, and a proportion of the structural units represented by (—$CH_2$—$C(R^1)$ ($R^2$-$A^1$)-) with respect to total structural units constituting the polymer is greater than 0% and no greater than 30 mol %.

2. The composition according to claim 1, wherein $A^1$ and $A^{11}$ in the formula (1) are each represented by formula (A):

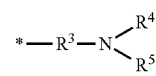

(A)

wherein in the formula (A),
$R^3$ represents a single bond or a divalent hydrocarbon group having 1 to 20 carbon atoms, and
$R^4$ and $R^5$ each independently represent: a hydrogen atom; a monovalent hydrocarbon group having 1 to 20 carbon atoms; or a group having —O—, —CO—, —NH— or a combination thereof between adjacent carbon atoms of the monovalent hydrocarbon group having 1 to 20 carbon atoms, or
at least two of $R^3$, $R^4$ and $R^5$ taken together represent a part of: an aliphatic heterocyclic structure having 3 to 20 ring atoms; or an aromatic heterocyclic structure having 5 to 20 ring atoms, together with the nitrogen atom to which the at least two of $R^3$, $R^4$ and $R^5$ bond.

3. The composition according to claim 1, wherein
the polymer comprises a structural unit derived from a first monomer and a structural unit derived from a second monomer having higher polarity than the first monomer, and
the structural units are in a random arrangement.

4. The composition according to claim 3, wherein the first monomer is a vinyl aromatic compound.

5. The composition according to claim 3, wherein the second monomer is (meth)acrylic acid or a (meth)acrylic acid ester.

6. A composition, comprising:
a polymer; and
a solvent,
wherein the polymer comprises a terminal structure represented by formula (2):

(2)

wherein, in the formula (2):
$A^2$ represents a monovalent group comprising an amino group; and
* denotes a bonding site to an end of the main chain of the polymer.

7. The composition according to claim 6, wherein $A^2$ in the formula (2) is represented by formula (A):

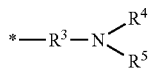 (A)

wherein in the formula (A),
$R^3$ represents a single bond or a divalent hydrocarbon group having 1 to 20 carbon atoms, and
$R^4$ and $R^5$ each independently represent: a hydrogen atom; a monovalent hydrocarbon group having 1 to 20 carbon atoms; or a group having —O—, —CO—, —NH— or a combination thereof between adjacent carbon atoms of the monovalent hydrocarbon group having 1 to 20 carbon atoms, or
at least two of $R^3$, $R^4$ and $R^5$ taken together represent a part of: an aliphatic heterocyclic structure having 3 to 20 ring atoms; or an aromatic heterocyclic structure having 5 to 20 ring atoms, together with the nitrogen atom to which the at least two of $R^3$, $R^4$ and $R^5$ bond.

8. The composition according to claim 6, wherein
the polymer comprises a structural unit derived from a first monomer and a structural unit derived from a second monomer having higher polarity than the first monomer, and
the structural units are in a random arrangement.

9. The composition according to claim 8, wherein the first monomer is a vinyl aromatic compound.

10. The composition according to claim 8, wherein the second monomer is (meth)acrylic acid or a (meth)acrylic acid ester.

11. An underlayer film for a directed self-assembled film in a directed self-assembly lithography process, formed from the composition according to claim 1.

12. The underlayer film according to claim 11, wherein a static contact angle of pure water on a surface of the underlayer film is no less than 70° and no greater than 90°.

13. A method of forming an underlayer film for a directed self-assembled film in a directed self-assembly lithography process, the method comprising applying the composition according to claim 1 directly or indirectly on a substrate to provide the underlayer film.

14. A directed self-assembly lithography process comprising:
applying the composition according to claim 1 directly or indirectly on an upper face side of a substrate to provide an underlayer film;
applying a composition capable of forming a directed self-assembled film on the upper face side of the underlayer film to form a coating film;
allowing phase separation of the coating film to form the directed self-assembled film having a plurality of phases;
removing at least a part of the plurality of phases of the directed self-assembled film to form a miniaturized pattern; and
etching the substrate using the miniaturized pattern as a mask.

15. The directed self-assembly lithography process according to claim 14, further comprising, prior to the applying of the composition capable of forming a directed self-assembled film, forming a prepattern having recessed portions on the upper face side of the underlayer film or the substrate, wherein
in the applying of the composition capable of forming a directed self-assembled film, the recessed portions of the prepattern are filled with the composition capable of forming a directed self-assembled film.

16. An underlayer film for a directed self-assembled film in a directed self-assembly lithography process, formed from the composition according to claim 6.

17. A method of forming an underlayer film for a directed self-assembled film in a directed self-assembly lithography process, the method comprising applying the composition according to claim 6 directly or indirectly on a substrate to provide the underlayer film.

18. A directed self-assembly lithography process comprising:
applying the composition according to claim 6 directly or indirectly on an upper face side of a substrate to provide an underlayer film;
applying a composition capable of forming a directed self-assembled film on the upper face side of the underlayer film to form a coating film;
allowing phase separation of the coating film to form the directed self-assembled film having a plurality of phases;
removing at least a part of the plurality of phases of the directed self-assembled film to form a miniaturized pattern; and
etching the substrate using the miniaturized pattern as a mask.

19. The directed self-assembly lithography process according to claim 18, further comprising, prior to the applying of the composition capable of forming a directed self-assembled film, forming a prepattern having recessed portions on the upper face side of the underlayer film or the substrate, wherein
in the applying of the composition capable of forming a directed self-assembled film, the recessed portions of the prepattern are filled with the composition capable of forming a directed self-assembled film.

20. The directed self-assembly lithography process according to claim 18, which is suitable to form a line-and-space pattern or a hole pattern.

* * * * *